United States Patent [19]
Osann, Jr. et al.

[11] Patent Number: 5,640,308
[45] Date of Patent: Jun. 17, 1997

[54] FIELD PROGRAMMABLE CIRCUIT MODULE

[75] Inventors: Robert Osann, Jr., San Jose; George A. Shaw, Jr., Felton; Amr M. Mohsen, Saratoga, all of Calif.

[73] Assignee: Aptix Corporation, San Jose, Calif.

[21] Appl. No.: 560,154

[22] Filed: Nov. 17, 1995

Related U.S. Application Data

[63] Continuation of Ser. No. 716,042, Jun. 14, 1991, abandoned.

[51] Int. Cl.$^6$ .............................. H05K 7/02; H01L 29/00
[52] U.S. Cl. ...................... 361/777; 174/250; 174/255; 174/261; 257/209; 257/210; 257/528; 257/529; 257/530; 361/778; 361/779; 361/782; 361/760; 361/806; 361/805
[58] Field of Search .................. 29/847, 846; 174/250, 174/253, 255, 260, 261; 257/209, 210, 208, 211, 528, 529, 530, 700, 723, 724, 786; 361/748, 760, 772, 773, 777, 778, 779, 805, 806; 439/68

[56] References Cited

U.S. PATENT DOCUMENTS

| | | | |
|---|---|---|---|
| 4,195,195 | 3/1980 | de Miranda et al. | 361/409 |
| 4,245,273 | 1/1981 | Feinberg et al. | 361/382 |
| 4,327,355 | 4/1982 | Genter et al. | 340/166 R |
| 4,354,228 | 10/1982 | Moore et al. | 364/200 |
| 4,455,495 | 6/1984 | Masuhara et al. | 357/51 |
| 4,458,297 | 7/1984 | Stopper et al. | 361/403 |
| 4,549,200 | 10/1985 | Ecker et al. | 357/80 |
| 4,613,924 | 9/1986 | Brault | 361/403 |
| 4,649,413 | 3/1987 | Kelly | 357/45 |
| 4,703,436 | 10/1987 | Varshney | 357/45 |
| 4,717,988 | 1/1988 | Landis | 361/403 |
| 4,727,268 | 2/1988 | Hori | 357/45 |
| 4,744,007 | 5/1988 | Watari et al. | 361/400 X |
| 4,761,881 | 8/1988 | Bora et al. | 361/403 |

(List continued on next page.)

FOREIGN PATENT DOCUMENTS

| | | | |
|---|---|---|---|
| 0310357 | 4/1989 | European Pat. Off. | 361/409 |
| 0405765 | 1/1991 | European Pat. Off. | 361/400 |
| 0481703A2 | 4/1992 | European Pat. Off. | |
| 59-161839 | 9/1984 | Japan . | |
| 61-105860 | 5/1986 | Japan | 174/260 |
| 63-46762 | 2/1988 | Japan | 357/75 |
| 1298794 | 1/1989 | Japan . | |
| 3-222492 | 10/1991 | Japan | 361/409 |
| 2237691 | 5/1991 | United Kingdom | 361/791 |
| WO82/02640 | 8/1982 | WIPO . | |
| WO90/15439 | 12/1990 | WIPO | 257/787 |

OTHER PUBLICATIONS

Electronics "Printed Circuits Get a New Boarder: The Plastic Leaded Chip–Carrier" vol. 55 No. 7 Apr. 7, 1982.

Wooley et al., "Active Substrate System Integration," *IEEE*, pp. 468–471, 1987.

Bogdan, "An Electrically Programmable Silicon Circuit Board," pp. 472–476.

Hantusch, "The PIM: A Programmable Interconnection Module," Nov., 1984.

*Primary Examiner*—Donald Sparks
*Attorney, Agent, or Firm*—Skjerven, Morrill, MacPherson, Franklin & Friel LLP; Brian D. Ogonowsky

[57] ABSTRACT

The invention uses a programmable interconnect substrate having a plurality of conductive and interconnectable vias located on one or both surfaces thereof. A customized pattern of bonding pads is then formed over the one or both surfaces of the substrate which correspond to the terminal footprints of specific surface mounted packages intended to be mounted on the substrate. A generalized pattern of bonding pads may also be formed on the surfaces of the substrate for electrically connecting terminals of bare dice thereto by means of thin wire. All bonding pads are electrically connected to one or more vias by direct electrical contact or by a conductive trace extending from the bonding pad to a nearby via.

27 Claims, 9 Drawing Sheets

U.S. PATENT DOCUMENTS

| | | | |
|---|---|---|---|
| 4,821,142 | 4/1989 | Ushifusa et al. | 361/395 |
| 4,821,176 | 4/1989 | Ward et al. | 364/200 |
| 4,829,404 | 5/1989 | Jensen | 361/400 X |
| 4,840,924 | 6/1989 | Kinbara | 361/414 |
| 4,847,732 | 7/1989 | Stopper et al. | 361/395 |
| 4,860,165 | 8/1989 | Cassinelli | 357/81 |
| 4,872,261 | 10/1989 | Sanyal et al. | 228/180.2 |
| 4,906,987 | 3/1990 | Venaleck et al. | 361/410 |
| 5,039,628 | 8/1991 | Carey | 437/183 |
| 5,060,116 | 10/1991 | Grobman et al. | 361/414 |
| 5,066,831 | 11/1991 | Spielberger et al. | 361/420 |
| 5,175,515 | 12/1992 | Abernathy et al. | 361/404 |
| 5,371,390 | 12/1994 | Mohsen | 257/209 |
| 5,377,124 | 12/1994 | Mohsen | 364/489 |
| 5,504,354 | 4/1996 | Mohsen | 257/209 |

FIELD PROGRAMMABLE CIRCUIT MODULE

This application is a continuation of application Ser. No. 07/716,042, filed Jun. 14, 1991 now abandoned.

CROSS-REFERENCE TO RELATED APPLICATIONS

The following co-pending applications are assigned to the assignee of the present invention and are related to the present application: "Field Programmable Printed Circuit Board" by Amr M. Mohsen, Ser. No. 07/410,194 now U.S. Pat. No. 5,377,124; "Interconnect Substrate with Circuits for Field Programmability and Testing of Multichip Modules and Hybrid Circuits" by Amr M. Mohsen, Ser. No. 07/598,417 now abandoned; and "Custom Tooled Printed Circuit Board" by Amr M. Mohsen, Ser. No. 07/466,153 now U.S. Pat. No. 5,055,973. The disclosures of these co-pending applications are incorporated herein by reference.

FIELD OF THE INVENTION

This invention relates to programmable interconnect substrates, and in particular to interconnect substrates where two or more devices are to be mounted thereon and programmably interconnected by the interconnect substrate.

BACKGROUND OF THE INVENTION

Multichip modules and hybrid circuits are commonly used to obtain a compact circuit with a desired function. These types of circuits are an inexpensive alternative to forming the circuit on a custom designed, single silicon die using microfabrication techniques. In one known embodiment of a compact circuit formed using these multichip modules and hybrid circuits, bare semiconductor chips are mounted on a custom fabricated substrate which has been constructed so that the necessary interconnections between the chips to be mounted on the substrate already exist.

In general, these types of hard-wired interconnect substrates require a large initial financial investment to fabricate, and a relatively long time is required to develop a prototype.

To reduce the lead time requirements and cost to fabricate interconnect substrates, programmable interconnect substrates have been introduced, such as those described in U.S. Pat. Nos. 4,458,297; 4,467,400; 4,487,737; and 4,479,088, all to Herbert Stopper. These patents disclose a programmable substrate intended specifically for the attachment of bare dice in specific locations on one side only of the substrate. One such programmable substrate is shown in prior art FIG. 1.

Figure 1:
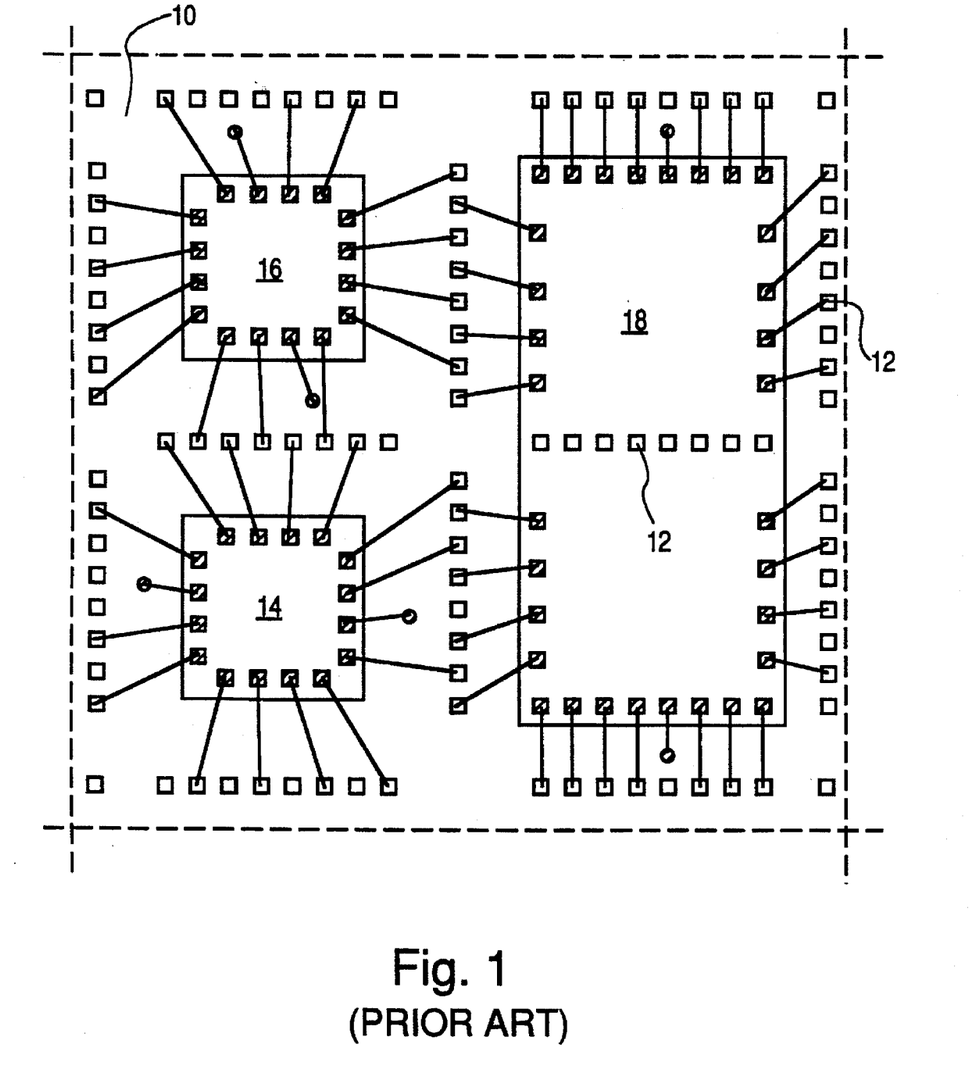
FIG. 1 shows the cell-based bonding pad pattern of a known prior art programmable substrate.

In FIG. 1, a pattern of cells is created on the surface of interconnect substrate 10, each cell offering a uniform pattern of bonding pads 12 for connection to terminals of bare die. Four cells are shown in FIG. 1, where each cell comprises a quadrant within the dashed line portion of FIG. 1; however, the substrate 10 contains many more cells. A small die, such as die 14 or die 16, may only occupy a single cell, while a large die, such as die 18, would occupy a number of adjacent cells. Large die 18 is shown as transparent in order to show the bonding pads 12 located under die 18. Since there are many different die sizes, the cell size (or size of a combination of cells) will often be larger than the optimal size for a particular die intended to be mounted on substrate 10. In this situation, portions of the interconnect substrate 10 would be wasted. Further, a single die may require more bonding pads than are offered by a cell; thus additional cells must be sacrificed.

The bonding pad patterns in the above-referenced patents to Stopper only support bare dice attachment. If a user of Stopper's technology were not able to obtain all the necessary circuit components as bare dice, but could only obtain the necessary circuit components through a combination of packaged components and bare dice, the interconnect substrate of FIG. 1 could not be used, since there is no provision on the substrate to mount a packaged device.

The programmable substrates described in the above-referenced patents are passive, having no transistors to aid in the programming or testing of the substrate.

Further, in the above-referenced patents to Stopper, interconnect elements are programmably formed between patterned metallization layers internal to the substrate. A first metallization layer contains a large number of parallel, separate conducting tracks which are orthogonal to a large number of parallel, separate conducting tracks in a second metallization layer. The tracks in the first layer, prior to programming, are not electrically connected to any tracks in the second layer. To program the substrate, a high voltage is applied between two orthogonal tracks. The dielectric material separating the two orthogonal tracks at their point of overlap is very thin so that the high potential difference breaks down the dielectric and causes the orthogonal tracks to fuse together at that point.

Such programmable interconnect elements are commonly known as antifuses, since they are an open circuit prior to programming. While incorporating these antifuses in a substrate enables the substrate to be fully programmed by programming relatively few antifuse elements, these antifuse elements have the drawback of being highly capacitive when unprogrammed, since each of these antifuse elements separate the metal layers by only a thin insulation layer portion. Because many of these antifuse elements are usually located along each conducting track, the total parallel capacitance can degrade the performance of circuits utilizing these interconnect substrates in certain applications.

Thus, an interconnect substrate which can efficiently accommodate both bare dice and packaged devices, and which has low capacitance conductive tracks is needed.

SUMMARY OF THE INVENTION

In accordance with the present invention, the drawbacks of prior art programmable substrates are overcome by providing a Field Programmable Circuit Module (FPCM) having a surface configuration enabling the space-efficient attachment thereto of virtually all sizes of bare dice, as well as packaged surface mounted devices. In addition, this invention provides the capability of attaching bare dice and packaged devices to both sides of the substrate.

The invention uses a programmable interconnect substrate having a plurality of conductive and interconnectable vias located on one or both surfaces thereof. A plurality of bonding pads is then formed over the one or both surfaces of the substrate, wherein the bonding pads are arranged in a pattern corresponding to the terminal footprints of specific surface mounted packages intended to be mounted on the substrate. A generalized pattern of bonding pads may also be formed on one or both surfaces of the substrate for electrically connecting terminals of bare dice thereto by means of thin wires. All bonding pads are electrically connected to one or more of the vias by direct electrical contact or by a conductive trace extending from each bonding pad to a nearby via.

A programmable substrate in accordance with this invention may be manufactured with active components within the substrate to provide assistance in programming and testing the many interconnect elements on the substrate.

Further, in one embodiment, the present invention incorporates burnable fuses in combination with antifuses to reduce the capacitance of the interconnect structure.

DETAILED DESCRIPTION

Figure 2A:
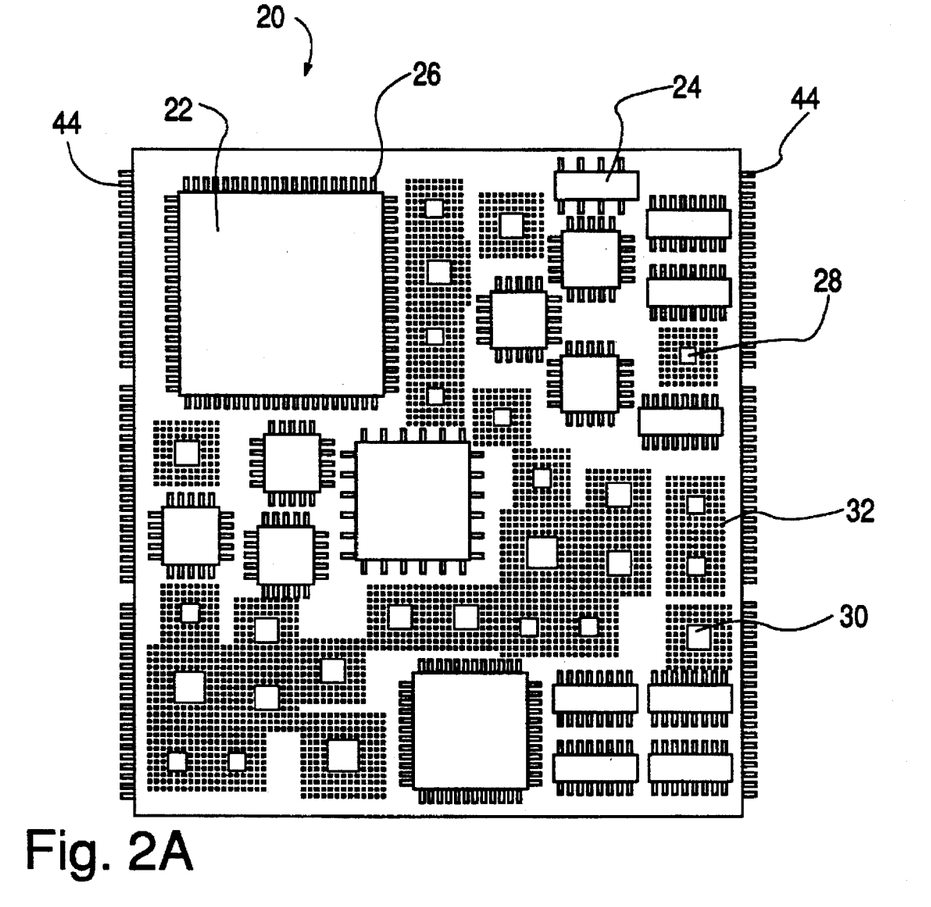
FIGS. 2a and 2b show a top view and a side view, respectively, of a circuit module of the present invention after programming and mounting of all circuit components, including both bare die and surface mounted packages.
Figure 2B:
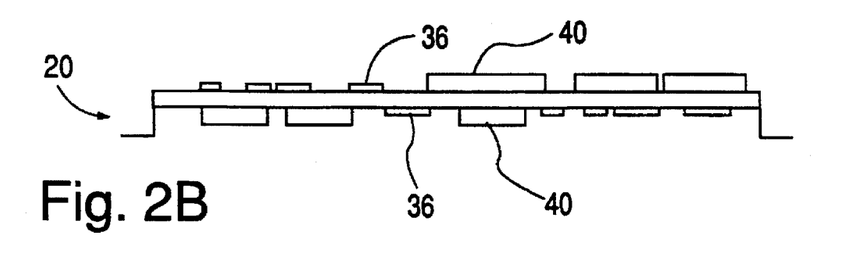

FIGS. 2a and 2b show a top view and a side view, respectively, of the Field Programmable Circuit Module (FPCM) 20 in accordance with a preferred embodiment of the invention, having packaged devices and bare dice mounted on both top and bottom surfaces of FPCM 20. The packaged devices and bare dice may contain integrated circuits or any type of active or passive components.

Surface mounted packages, such as packages 22 and 24, have terminals, for example terminal 26 on package 22, wherein the terminals on a package are separated from each other by a certain distance. This separation may be different for different packages, as illustrated by the separation between terminals for package 24 being larger than the separation between terminals for package 22.

Due to this variation in terminal separations, certain surface mounted packages cannot be mounted on the interconnect substrate of prior art FIG. 1, where the bonding pads are arranged in a fixed and regular pattern on the substrate, since the spacings between bonding pads would not correspond to the spacings between terminals of certain surface mounted packages. It would be virtually impossible to efficiently accommodate the wide variety of fixed terminal spacings of surface mounted packages on a preconfigured array of bonding pads.

However, the terminals of bare dice, such as dice 28 and 30 in FIG. 2a, are connectable to bonding pads 32 via flexible thin wires (not shown); therefore, the bonding pad spacing and terminals of the bare dice do not have to match up precisely. Thus, a preconfigured bonding pad arrangement may accommodate virtually any type of bare die irrespective of the separations between terminals on the bare die.

In one embodiment of the invention, in order to mount both packaged devices and bare dice on FPCM 20 of FIG. 2a, portions of the surface of FPCM 20 have arranged thereon a pattern of bonding pads (one such bonding pad shown as pad 32) to accommodate one or more bare dice.

The surface of FPCM 20 is also configured with a plurality of bonding pads (one such bonding pad being located under terminal 26) which are specifically patterned to correspond with terminals of particular surface mounted packages intended to be mounted on FPCM 20.

Figure 7:
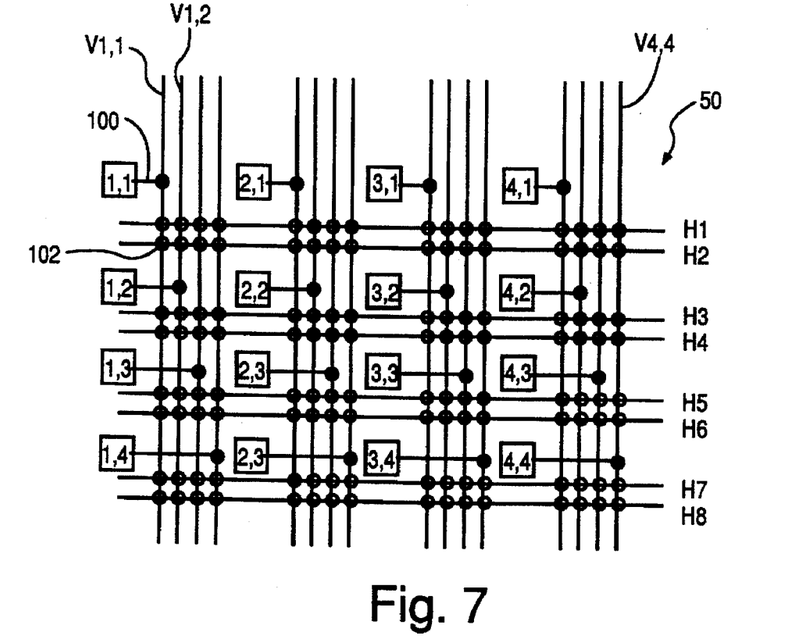
FIG. 7 is a schematic representation of the programmable interconnections within an interconnect substrate in accordance with one embodiment of the invention.

The bonding pads are interconnected by programmable interconnection means, to be described with respect to FIG. 7, located within FPCM 20.

In the embodiment of the invention shown in FIGS. 2a and 2b, the surface of FPCM 20 has been customized for a particular need of a user. The user identifies to the manufacturer of FPCM 20 the number and sizes of bare dice to be mounted on FPCM 20, the number and types of packages to be mounted on FPCM 20, and the interconnections between the terminals of these components. The surfaces of FPCM 20 are then customized with a bonding pad configuration which specifically accommodates terminal footprints of the surface mounted packages and which accommodates the one or more bare dice to be mounted on FPCM 20. Thus, the bond pad configuration on the surface of FPCM 20 may differ for each user's needs.

Since, to reduce propagation time and capacitance, electrical interconnections between the various devices mounted on the substrate should be as short as possible, the bonding pad configuration on the surface of FPCM 20 is made so that devices which will be communicating with one another are located as close to each other as is practical.

In FPCM 20 of FIG. 2a, a relatively dense pattern of bonding pads surrounding each bare die provides the bare die with a relatively large number of bonding pads within a small area with which the die can be electrically connected so that very little substrate area is wasted. The regular pattern of bonding pads may be discontinuous beneath a bare die or the pattern may extend beneath a bare die. If the regular pattern of bonding pads is to extend under a bare die, the underside of the bare die should be insulated from the pattern.

As shown in FIG. 2b, FPCM 20 may be made double sided so that bare dice 36 and surface mounted packages 40 may be mounted on both sides of FPCM 20.

Edge pins 44, shown in FIG. 2a, may provide the electrical input and output ports for FPCM 20 as well as provide access to the programmable interconnect elements within FPCM 20 for programming FPCM 20.

Figure 3:
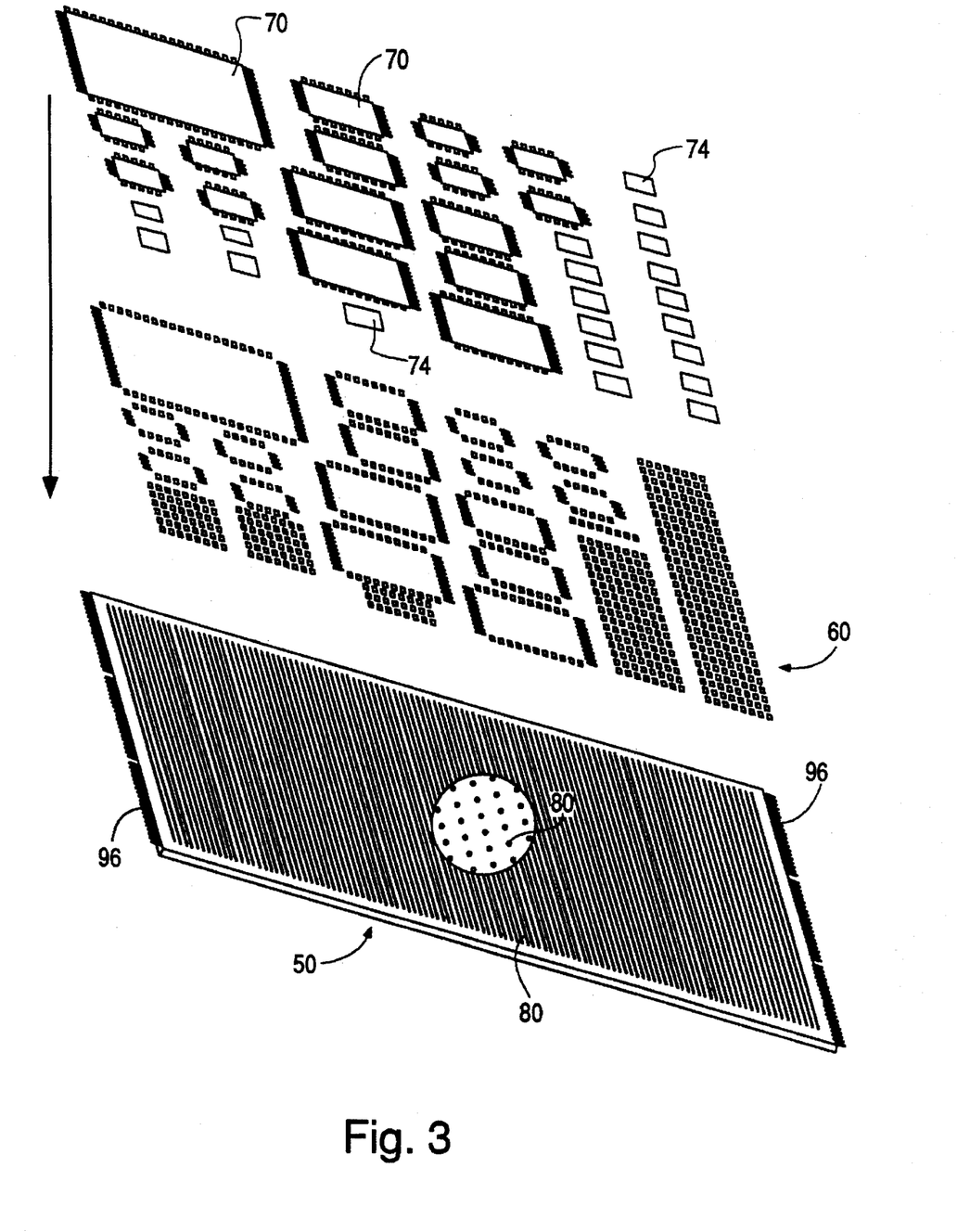
FIG. 3 is an exploded view of a circuit module of the present invention.

FIG. 3 is an exploded view which illustrates the three major portions of a completed FPCM in accordance with a preferred embodiment of the invention.

Although a completed FPCM may be surface customized for a particular user's needs to accommodate one or more surface mounted devices, the customized FPCM uses a programmable interconnect substrate 50 which is prefabricated and used for any number of customized bonding pad configurations. Thus, the substrate 50 may be made in volume inexpensively.

Bonding pads 60, shown in FIG. 3, are arranged on the surface of substrate 50 in a custom configuration to accommodate the physical arrangement of the surface mounted devices 70 and bare dice 74.

In order to programmably interconnect any of the bonding pads 60 in FIG. 3 with any of the other bonding pads 60, programmable interconnect substrate 50 has exposed on its surface a grid of conductive vias 80 (shown as a grid of dots), wherein each via 80 may be connected to any other via 80 by appropriate programming of substrate 50, to be described later with respect to FIG. 7. A close up of a portion of the surface of substrate 50 is shown to better illustrate vias 80.

Each conductive bonding pad 60 is electrically connected to a via 80 by either forming the conductive bonding pad 60 so as to be located directly on a via 80 or by connecting a bonding pad 60 to a nearby via 80 using a thin wire or a conductive trace formed from the bonding pad material itself.

Figure 4:
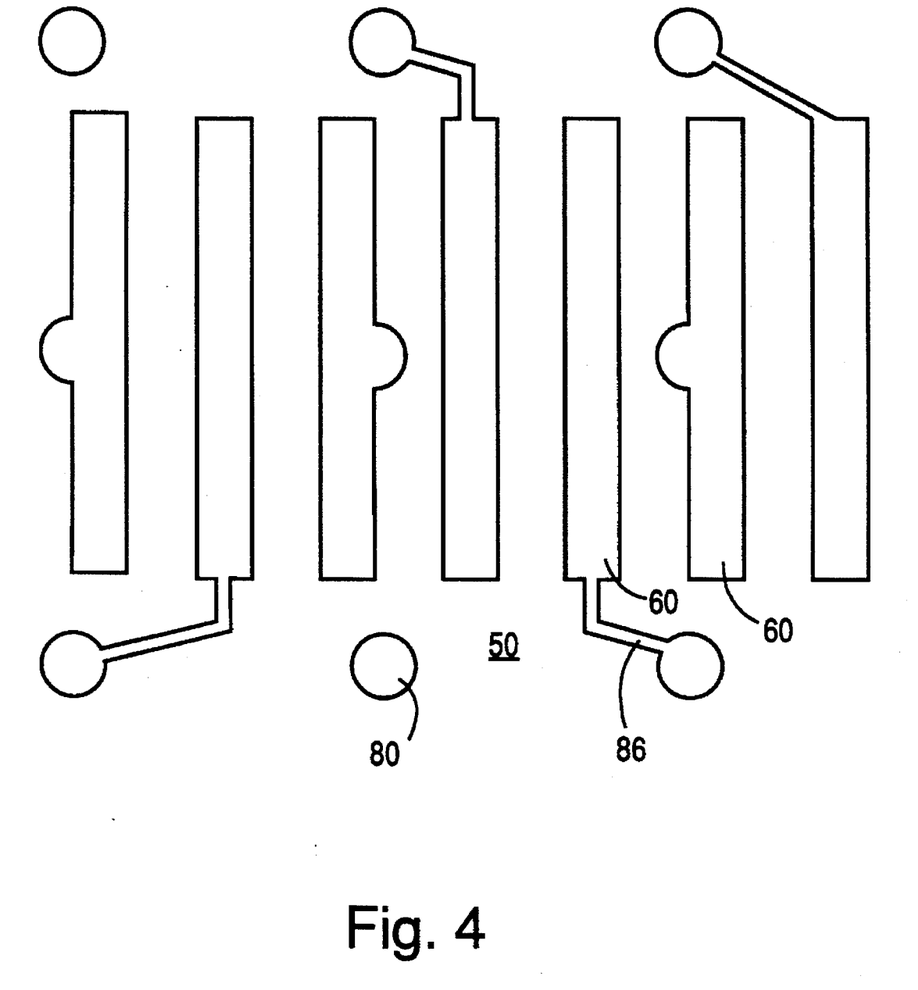
FIG. 4 is a close-up top view of a circuit module of the present invention showing bonding pads arranged over vias exposed on a surface of an interconnect substrate.

The electrical connection of the bonding pads 60 with vias 80 of the interconnect substrate 50 is further explained with respect to FIG. 4, which shows a portion of substrate 50 with bonding pads (two of which are labelled as 60) formed thereon greatly enlarged. The bonding pads for attachment of the terminals of surface mounted devices thereto may be larger than bonding pads for attachment of thin wires thereto to accommodate the physical size of the terminals of the surface mounted devices. The dots in FIG. 4 represent the conductive vias 80 exposed on the surface of substrate 50. As seen, when the terminal separation of the surface mounted packages causes bonding pads 60 to not align with a via 80 to make direct electrical contact thereto, the bonding pads 60 are electrically connected to the nearest via 80 with a thin wire or conductive trace, such as trace 86.

With respect to the bare dice, such as bare die 74 in FIG. 3, the vias 80 themselves may act as bonding pads for the dice if the vias 80 are formed so as to be capable of having a thin wire bonded to them by an automatic wire tacking device well known to those skilled in the art. Thus, terminals on the dice may also be directly connected to the vias 80 using a thin wire. In this manner, if appropriate, no additional bonding pads need to be formed on the surface of substrate 50 for connection to the bare dice.

Figure 5:
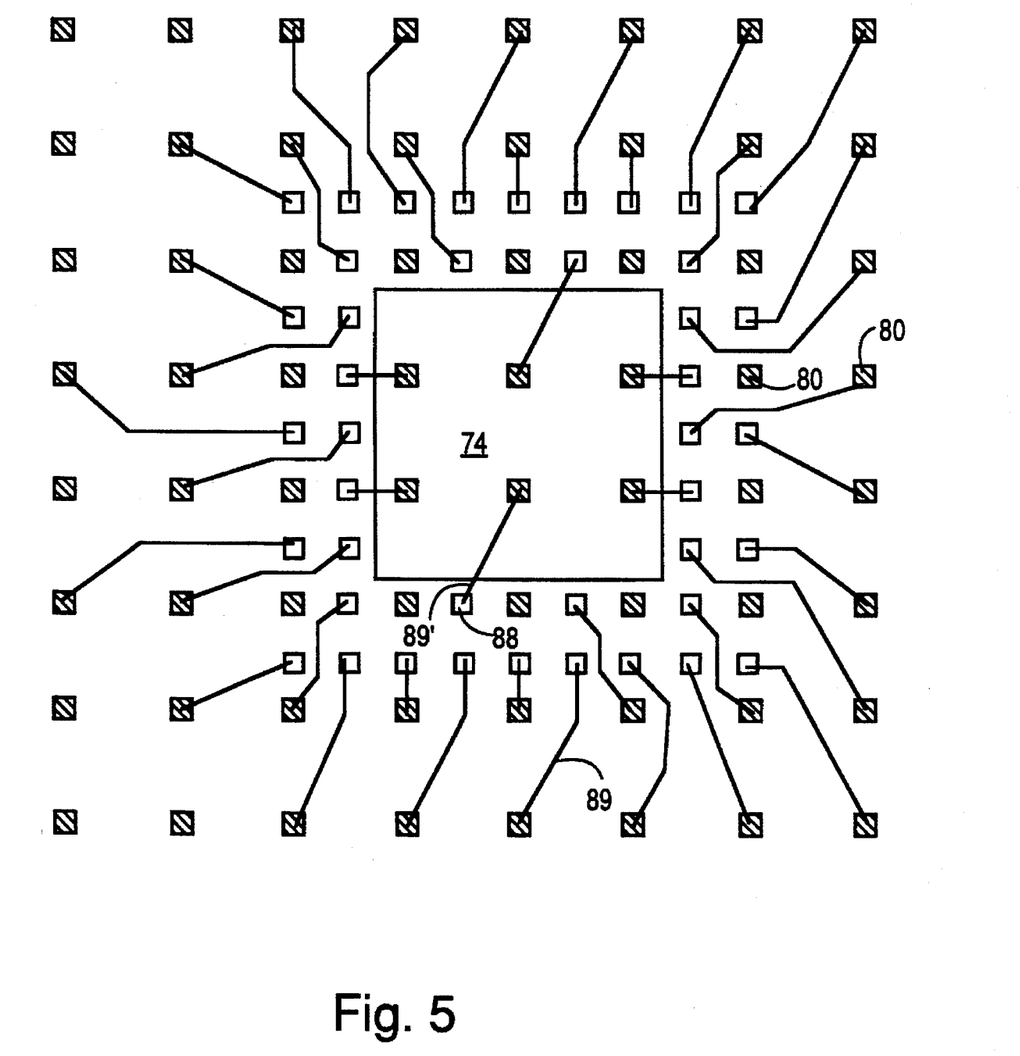
FIG. 5 is a close-up top view showing optional customization of the surface of an interconnect substrate for the mounting of bare die.

However, due to the generally small size of bare dice, frequently there are fewer vias 80 immediately surrounding each bare die than are necessary to accommodate all the terminals on the bare die. To provide a sufficient number of bonding pads immediately surrounding the bare die, additional bonding pads may be provided on the substrate between the vias 80, wherein these additional bonding pads are connected to vias 80 using a wire or a conductive trace formed at the same time as the bonding pads. This is shown in FIG. 5, where terminals (not shown) of bare die 74 (shown transparent in order to view underlying vias) may be either directly connected with wire to vias 80 (black squares) and/or connected to vias 80 by first being connected to peripheral bonding pads 88 (white squares), and bonding pads 88 then being connected to a via 80 with a conductive trace 89 or a wire. Additionally, since the bare die 74 will be insulated from vias under the die, these additional bonding pads 88 may be connected to the vias under the bare die, such as with trace 89', to make the fullest utilization of the substrate real estate.

Figure 6:
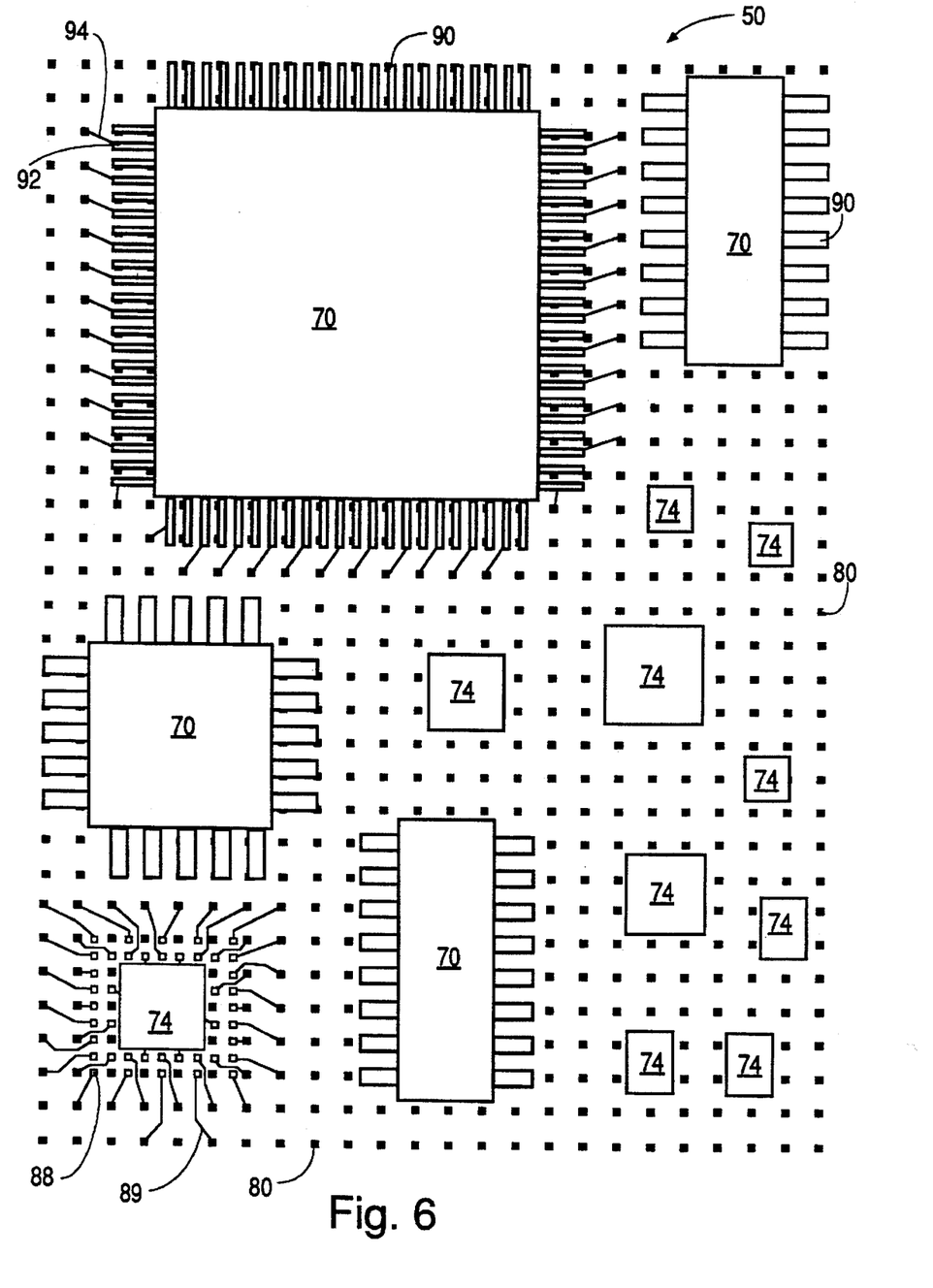
FIG. 6 is a top view of the circuit module of the present invention illustrating how bonding pads may be electrically connected to vias exposed on a surface of an interconnect substrate.

Shown in FIG. 6 is a grid of vias 80 (small black squares) on the surface of interconnect substrate 50, wherein surface mounted packages 70 along with bare dice 74 are mounted on substrate 50. The details of the interconnection of only one of the bare dice 74, previously discussed with respect to FIG. 5, is shown for simplicity. For each of the terminals of the surface mounted packages 70 (e.g., terminals 90 and 92), there is an associated bonding pad (obscured by the terminals) under the terminal to which the terminal is soldered or otherwise bonded. As seen, where a terminal, such as terminal 90, aligns with a via 80, no conductive trace is needed to electrically couple the underlying bonding pad to a via 80, but where a terminal, such as terminal 92, does not align with a via 80, a wire or conductive trace 94 is needed to electrically couple the bonding pad to a via 80.

If the size of a bonding pad is such that it overlaps two or more vias, any of the contacted vias may provide the electrical connection to the bonding pad. Further, more than one of the contacted vias may be used if it is desired to conduct a relatively high current to the bonding pad.

The customized configuration of bonding pads, such as bonding pads 60 shown in FIG. 3, on the surface of interconnect substrate 50, may be formed of copper or other conductive material and may be formed on interconnect substrate 50 using any well known etching process or additive process, such as plating. One type of etching process may entail bonding a single thin sheet of copper onto the surface of substrate 50 and then etching the copper using any number of well known techniques.

Another method for forming the customized configuration of bonding pads 60 on the surface of interconnect substrate 50 is to use a patterned screen type of process, wherein the patterned screen is placed over interconnect substrate 50 and copper is deposited only where the screen dictates the bonding pads should be formed.

Prior to mounting the surface mounted packages 70 and bare dice 74 on substrate 50 in FIG. 3, and preferably prior to even forming the bonding pads 60 on substrate 50, interconnect substrate 50 is programmed using a suitable automatic programming means to selectively interconnect vias 80 to provide the desired interconnections for the devices to be mounted on substrate 50. In one embodiment, a commercially available, Z-axis conductive elastomer sheet is used to program substrate 50, where the Z-axis conductive elastomer sheet contains many small parallel conductors insulated from one another and having their ends exposed on both surfaces of the sheet. The sheet is placed over the exposed vias 80 or bonding pads 60 and programming voltages are applied to the appropriate areas of the Z-axis conductive elastomer sheet to apply programming voltages between the vias 80 or bonding pads 60 to be interconnected. The programmable interconnection elements within substrate 50 are described below.

Edge pins 96, shown extending from the edge of substrate 50 in FIG. 3, are generally used as input/output ports but may also be used to aid in programming the interconnect elements within substrate 50. If edge pins 96 are to be used to program the interconnect elements within substrate 50, substrate 50 would have formed on it active devices (such as diodes and/or transistors). Such active devices may form an X-Y matrix addressing system or a multiplexer to access the numerous internal interconnect elements with relatively few edge contacts.

In one embodiment, interconnect substrate 50 has an interconnect structure resembling that shown in FIG. 7, where only sixteen vias (white squares) are shown for simplicity. A similar substrate and alternative substrates are fully described in U.S. patent application, Ser. No. 07/598, 417, by Amr M. Mohsen, incorporated herein by reference. Numerous other embodiments of interconnect substrate 50 will be obvious to one of ordinary skill in the art after understanding the operation of interconnect substrate 50 of FIG. 7. In FIG. 7, the sixteen vias are identified as X,Y, where X is the column number from 1 to 4, and Y is the row number from 1 to 4. Each of the vias, such as via 1,1, is preferably a conductive area exposed at the surface of substrate 50 to enable the subsequently formed bonding pads to make electrical contact with the via. Each via is connected to a vertical conductive track within substrate 50 by a means of a conductive trace, such as trace 100. In FIG. 7, these vertical tracks are illustrated as V A,B, where A is the column number of the via from 1 to 4 associated with the vertical track, and B is the row number of the via associated with the track from 1 to 4. In the example of FIG. 7, there are sixteen vias and sixteen vertical tracks so that one vertical track is associated with each via. The vertical tracks are all located in the same plane within substrate 50.

Also shown in FIG. 7 are horizontal conductive tracks H1 through H8, although there may be more or less horizontal tracks as deemed necessary by the designer. Horizontal tracks H1 through H8 are formed in a single plane below the plane of vertical tracks V A,B. The vertical tracks are insulated from one another and also insulated from the horizontal tracks when using antifuses as the programming elements for selectively interconnecting the horizontal and vertical tracks where they cross.

These vertical and horizontal tracks may be formed of any appropriate conductive material, such as silicide, doped polycrystalline silicon, metal, or metal composites. These tracks are formed in a manner well known in the semiconductor processing arts and thus the method of forming these tracks need not be discussed.

In one embodiment, the horizontal and vertical tracks have differing segment lengths across substrate 50 to reduce the parasitic capacitance of a particular segment of a track.

Conductive traces 100, which connect each via to an associated vertical track, extend from the via contact to an associated vertical track and are formed by methods well known in the art. Vias may be located on both sides of substrate 50 and each via connected to a uniquely associated vertical track.

In the embodiment shown in FIG. 7, programming elements 102, represented by open circles, are antifuses, which means they provide an open circuit until programmed. In order to electrically short selected vias together, a high programming voltage is applied between a first vertical track and a certain horizontal track in order to short the first vertical track to the horizontal track where the tracks overlap. Once a horizontal track is so shorted to a vertical track, this horizontal track may be interconnected with any other vertical track by shorting that vertical track to the horizontal track in the same manner. For example, to short via 1,1 to via 4,4, a high programming voltage is applied between vertical track V1,1 and horizontal track Hi, and a high programming voltage is applied between horizontal track H1 and vertical track V4,4. Via 1,1 will now be shorted to via 4,4.

Figure 8:
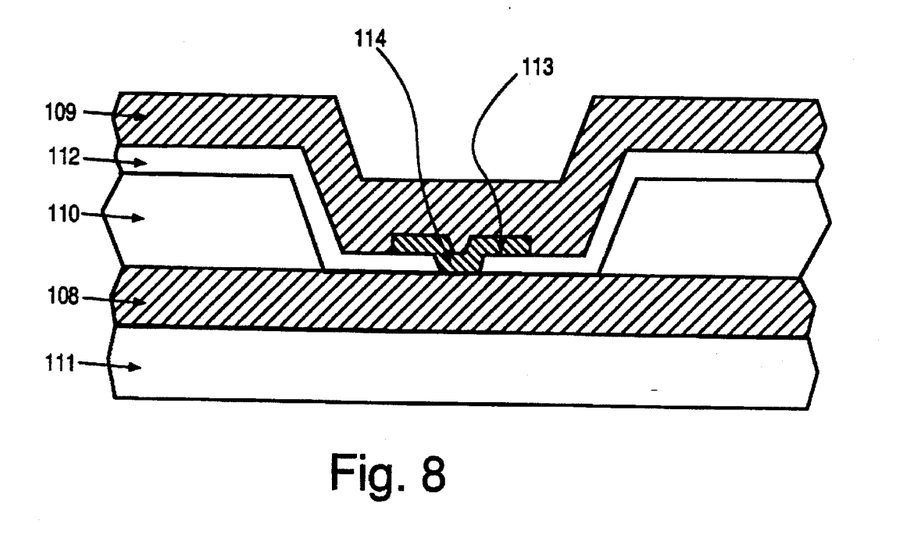
FIG. 8 is a cross-section of a programmable antifuse.

One embodiment of an antifuse which may be used as programming element 102 in FIG. 7 is shown in FIG. 8.

In FIG. 8, a cross-section of horizontal and vertical tracks 108 and 109, respectively, is shown where the tracks have at their intersection a programmable interconnect structure such as an antifuse. A similar antifuse is located at each programmable intersection of a horizontal and vertical track. Typically, an antifuse comprises a capacitive structure with a dielectric capable of being broken down by the application of a selected programming voltage to provide a conductive path between the two plates of the capacitor. Thick dielectric layer 110 (typically 2 to 25 microns thick), typically formed of silicon dioxide, silicon nitride, polyimide, organic material, or a combination thereof, is formed over horizontal track 108.

Thick dielectric 111 separates horizontal track 108 from a vertical track which may be formed on the opposite surface of the substrate.

A portion of thick dielectric 110 is removed to expose a portion of horizontal track 108. Thin dielectric 112 (0.5 micron to 2 microns), also typically formed of silicon dioxide, silicon nitride, polyimide, organic materials or a combination thereof, is formed over dielectric 110 and the exposed portion of horizontal track 108. A portion of dielectric 112 is removed to provide via opening 114, which is small relative to the opening in dielectric 110. Antifuse dielectric 113 is then formed to fill via opening 114. In one embodiment, via opening 114 has a dimension on the order of one or two microns, but the actual opening 114 may be smaller or larger than this depending on the antifuse dielectric 113, the operating parameters, and the tolerable parasitic capacitance between tracks 108 and 109. Antifuse dielectric 113 is typically formed of amorphous silicon or undoped polycrystalline silicon, or single or multiple layers of dielectrics such as silicon oxides and silicon nitrides. Antifuses are well known in the art and thus antifuse dielectric 113 will not be described in detail.

Other kinds of programmable elements, such as transistors acting as controllable switches, can also be used depending upon design considerations.

In one embodiment of the invention, antifuses in combination with conventional burnable fuses, which provide a short until blown, are used to reduce the capacitance of the various tracks within the interconnect substrate. In this embodiment, the blowable fuses act as the interconnect elements between horizontal and vertical tracks, and antifuses are employed in-line within a set of tracks. To blow a burnable fuse to thus disconnect a vertical track from a horizontal track, an associated antifuse is first shorted to complete a circuit through the associated burnable fuse interconnecting a vertical track to a horizontal track. Next, a high current is passed through the burnable fuse to create an open circuit between the two orthogonal tracks. Using this arrangement reduces the final capacitance of any signal path through the substrate, since fewer unprogrammed antifuses remain after programming the substrate than if antifuses alone were employed as the programmable interconnect elements between the intersections of vertical tracks and horizontal tracks.

Testing of the proper programming of the substrate may be performed with the aid of active devices formed on substrate 50, as described in co-pending application Ser. No. 07/598,417 to Amr Mohsen. The substrates described in U.S. application, Ser. No. 07/598,417 may be readily modified to form substrate 50 of this invention.

Referring again to FIG. 3, after interconnect substrate 50 is programmed to selectively interconnect vias 80, and bonding pads 60 are formed on interconnect substrate 50, the surface mounted packages 70 are then automatically positioned on substrate 50 using any well known type of positioning device, with the terminals of packages 70 overlying their associated bonding pads. In the preferred embodiment, the terminals are first coated with a solder paste before being positioned over the bonding pads. A subsequent heating process then melts the solder paste, thus electrically connecting and bonding the terminals to their associated bonding pads. The bare die 74 would similarly be automatically positioned on the substrate 50 and their terminals connected to the bonding pads 60 or vias 80 with wire using any well known type of automatic wire tacking machine. The undersides of bare dice 74 may be secured to the surface of substrate 50 with a nonconductive epoxy or similar bonding material.

Figure 9:
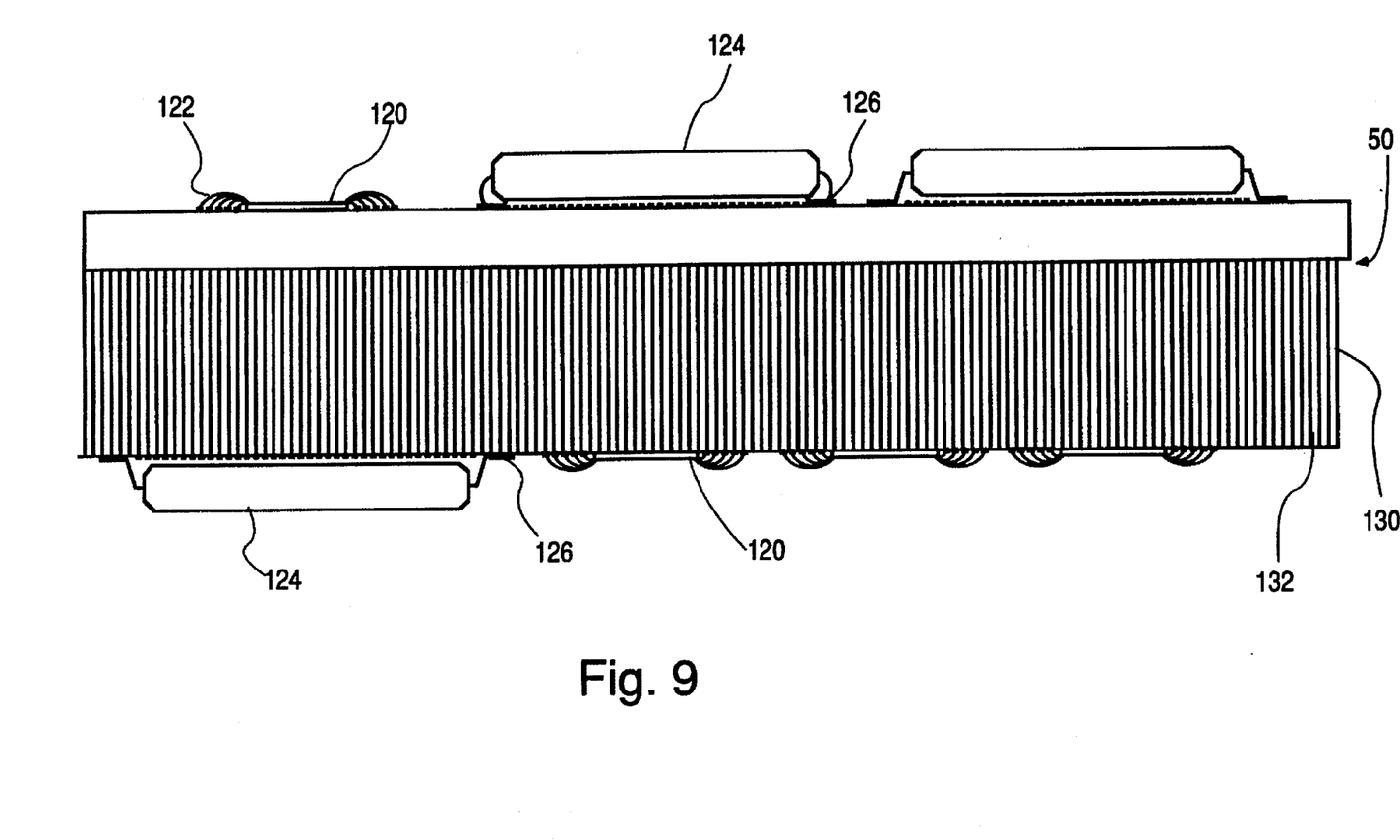
FIG. 9 is a cross-section of a circuit module of the present invention showing how surface mounted packages and bare die may be mounted on both sides of an interconnect substrate.

FIG. 9 shows an enlarged cross-section of interconnect substrate 50 with bare dice 120 mounted on both surfaces thereof and being connected to vias and/or bonding pads with wires 122. Also shown are various types of surface mounted packages 124 being directly connected to bonding pads 126 on both surfaces of substrate 50, which in turn are electrically connected to vias on substrate 50. Electrical via connections 130 extend through a thick insulator layer 132, which provides mechanical strength to substrate 50, to connect the vias exposed on the bottom surface of layer 132 to substrate 50.

Figure 10:
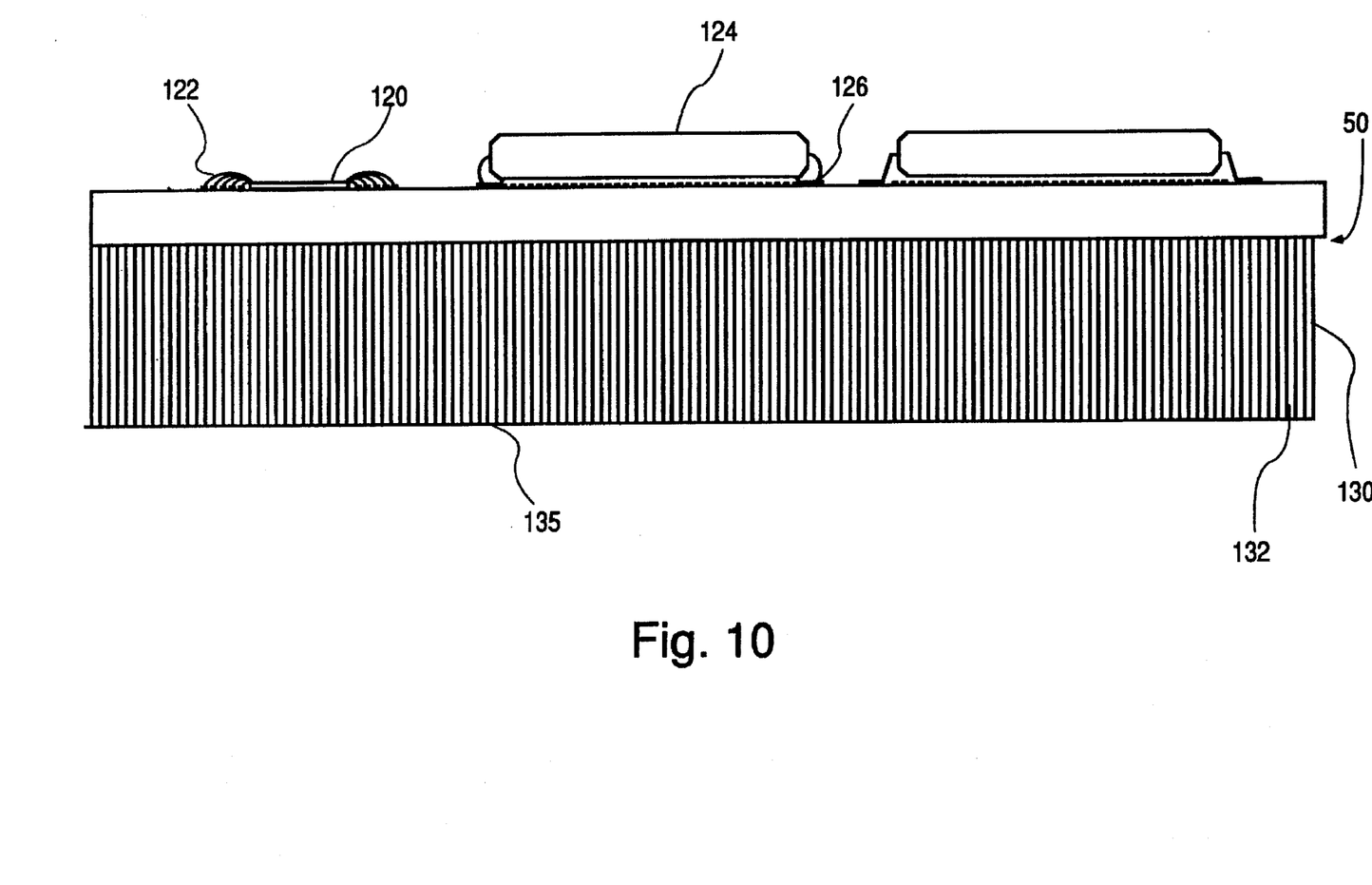
FIG. 10 is a cross-section of a circuit module similar to that shown in FIG. 9 except devices are mounted on only one side of the interconnect substrate, and the other side is used to provide input/output terminals or pads.

FIG. 10 shows another embodiment of the invention similar to that shown in FIG. 9 but where via connections 130 are connected to a number of input/output (I/O) pads 135 (shown collectively as a large-width line) formed on the bottom surface of substrate 50. This embodiment may be preferable to the embodiment of FIG. 9 to avoid heat buildup from devices mounted on both sides of substrate 50.

Each I/O pad 135 may be associated with a single one of via connections 130 or may be formed in any other pattern on the bottom surface of substrate 50 to provide the required electrical access to the various terminals of bare die 120 and surface mounted packages 124.

In one version of the device of FIG. 10, I/O pads 135 are connected to via connections 130 through an additional programmable substrate means (similar to substrate 50) mounted to the bottom surface of substrate 50 so as to localize and reduce the number of I/O pads 135 required to provide electrical contact to the terminals of devices 120 and 124. Such reduction in I/O pads 135 would simplify requirements for a connector to electrically connect I/O pads 135 to one or more external devices.

Thus, embodiments of an efficient surface configuration for a programmable interconnect substrate have been described which enable the mounting of a wide variety of surface mounted packages as well as bare dice to the programmable interconnect substrate.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

We claim:

1. A programmable interconnect substrate having an improved surface configuration with a plurality of bonding pads formed on a surface thereof, the improvement comprising:

said bonding pads being non-uniformly arranged on said surface of said programmable interconnect substrate so as to form a plurality of different footprint patterns, each of said patterns being specifically designed to match a terminal configuration of one of a plurality of different surface mounted packages which have been previously selected to be mounted on said substrate, said surface of said interconnect substrate also including bonding terminals for connection to terminals of one or more bare dice.

2. The interconnect substrate of claim 1 wherein said bonding terminals for connection to terminals of said bare dice are bonding pads arranged in a pattern to accommodate a variety of bare dice sizes.

3. The interconnect substrate of claim 1 wherein said bonding terminals for connection to terminals of said bare dice are vias formed on said surface of said substrate, wherein said vias are formed as a uniform grid of vias over said surface of said substrate.

4. The interconnect substrate of claim 3 wherein said bonding terminals also comprise bonding pads arranged on said surface of said substrate in an area proximate to an intended location of a bare die.

5. The interconnect substrate of claim 1 wherein said bonding pads are arranged on both a first side of said substrate and on an opposite side of said substrate.

6. The interconnect substrate of claim 1 wherein said bonding pads are interconnected through programmable interconnect devices formed within said substrate.

7. The interconnect substrate of claim 6 wherein said interconnect devices are antifuses which provide an electrical open circuit until programmed to provide an electrical short circuit.

8. The interconnect substrate of claim 1 wherein said bonding pads are formed on said surface of said substrate so that each bonding pad is in electrical contact with one or more vias formed on said surface of said substrate, wherein said vias are substantially formed as a grid of vias over said surface of said substrate.

9. The interconnect substrate of claim 8 wherein one or more of said bonding pads are formed on said substrate so as to overlie one or more vias so as to be in direct electrical contact therewith.

10. The interconnect substrate of claim 9 wherein certain bonding pads are formed on said surface of said substrate so as not to overlie any of said vias, electrical contact between said certain bonding pads and an associated via being made with an electrical conductor which is not a bonding pad.

11. The interconnect substrate of claim 1 wherein said bonding pads are arranged on one side of said substrate and input/output pads, for electrically connecting said substrate to external devices, are arranged on an opposite side of said substrate.

12. A programmable interconnect substrate comprising:

a programmable substrate having a top surface for mounting a plurality of individual electronic devices thereon, said top surface having formed thereon a uniform grid of conductive vias, wherein substantially each of said vias is programmably interconnectable to another of said vias through programmable means internal to said substrate for connecting one or more terminals of one electronic device mounted on said top surface to one or more terminals of another electronic device mounted on said top surface, said programmable interconnect substrate further comprising conductive bonding pads, for bonding to terminals of a plurality of selected surface mounted packages directly thereto, being non-uniformly arranged on said surface of said substrate so as to each electrically contact one or more of said vias, said bonding pads being non-uniformly arranged on said surface of said substrate so as to form a plurality of different footprint patterns, each of said patterns being specifically designed to match a terminal configuration of one of said plurality of selected surface mounted packages.

13. The programmable interconnect substrate of claim 12 wherein said vias provide bonding terminals for bare die mounted on said surface of said substrate.

14. The programmable interconnect substrate of claim 12 wherein additional bonding pads are arranged on said surface of said substrate for electrical connection to terminals of one or more bare dice, wherein said additional bonding pads are electrically connected to associated vias.

15. The programmable interconnect substrate of claim 14 wherein said additional bonding pads are arranged on said surface of said substrate in an area proximate to an intended location of a bare die.

16. The programmable interconnect substrate of claim 14 wherein said additional bonding pads for said bare die are not located under where a bare die is to be mounted.

17. The programmable interconnect substrate of claim 12 wherein said bonding pads are not located under where a surface mounted package is to be mounted on said surface of said substrate.

18. The programmable interconnect substrate of claim 12 wherein said surface mounted packages and bare dice are mounted on both a first surface of said substrate and an opposite surface of said substrate.

19. The programmable interconnect substrate of claim 12 wherein input/output pads, for electrically connecting said substrate to external devices, are formed on a first surface of said substrate, and said grid of conductive vias are formed on an opposite surface of said substrate.

20. A method for forming a programmable interconnect substrate comprising the steps of:

fabricating a programmable substrate having a top surface for mounting a plurality of individual electronic devices thereon, said top surface having formed thereon a uniform grid of conductive vias, wherein substantially each of said vias is programmably interconnectable to another of said vias through programmable means internal to said substrate for connecting one or more terminals of one electronic device mounted on said top surface to one or more terminals of another electronic device mounted on said top surface; and arranging conductive bonding pads, for bonding to terminals of a plurality of selected surface mounted packages directly thereto, on said surface of said substrate so as to each electrically contact one or more of said vias, said bonding pads being non-uniformly arranged on said surface of said substrate so as to form a plurality of different footprint patterns, each of said patterns being specifically designed to match a terminal configuration of one of said plurality of selected surface mounted packages.

21. The method of claim 20 wherein said vias provide bonding terminals for bare dice mounted on said surface of said substrate.

22. The method of claim 20 further comprising the step of arranging additional bonding pads on said surface of said substrate for electrical connection to terminals of one or more bare dice, wherein said additional bonding pads are electrically connected to associated vias.

23. The method of claim 22 wherein said additional bonding pads are arranged on said surface of said substrate in an area proximate to an intended location of a bare die.

24. The method of claim 22 wherein said additional bonding pads for said bare die are not located under where a bare die is to be mounted.

25. The method of claim 20 wherein said bonding pads are not located under where a surface mounted package is to be mounted on said surface of said substrate.

26. The method of claim 20 wherein said bonding pads are arranged on both a first surface of said substrate and an opposite surface of said substrate.

27. The method of claim 20 further comprising the step of forming input/output pads, for electrically connecting said substrate to external devices, on a surface of said substrate opposite a surface on which said grid of conductive vias are formed.

* * * * *